United States Patent

Ha et al.

Patent Number: 5,880,012
Date of Patent: Mar. 9, 1999

[54] METHOD FOR MAKING SEMICONDUCTOR NANOMETER-SCALE WIRE USING AN ATOMIC FORCE MICROSCOPE

[75] Inventors: Jeong-Sook Ha; Kang-Ho Park, both of Daejeon, Rep. of Korea

[73] Assignee: Electronics And Telecommunications Research Institute, Daejeon, Rep. of Korea

[21] Appl. No.: 842,868

[22] Filed: Jul. 17, 1997

[30] Foreign Application Priority Data

Dec. 6, 1996 [KR] Rep. of Korea .................. 1996 62619

[51] Int. Cl.$^6$ .................................................... H01L 21/20
[52] U.S. Cl. ........................................... 438/494; 438/962
[58] Field of Search .............................. 438/962, 32, 494, 438/498, 478

[56] References Cited

U.S. PATENT DOCUMENTS

| | | | |
|---|---|---|---|
| 5,416,331 | 5/1995 | Ichikawa et al. ..................... | 250/492.2 |
| 5,512,808 | 4/1996 | Clark, Jr. et al. ........................ | 318/575 |
| 5,518,955 | 5/1996 | Goto et al. ................................ | 438/494 |

OTHER PUBLICATIONS

Lyding, J.W., et al. Nanometer scale patterning and oxidation of silicon surfaces with an ultrahigh vacuum scanning tunneling microscope, J. Vac. Sci. Technol., vol. 12, No. 6, pp. 3735–3740, Nov./Dec. 1994.

Perkins, F.K., et al. Fabrication of 15 nm wide trenches in Si by vacuum scanning tunneling microscope lithography of an organosilane self–assembled film and reactive ion etching, Appl. Phys. Lett., vol. 68, No. 4, pp. 550–552, Jan. 22, 1996.

*Primary Examiner*—Charles Bowers
*Assistant Examiner*—Keith Christianson
*Attorney, Agent, or Firm*—Cohen, Pontani, Lieberman & Pavane

[57] ABSTRACT

The present invention provides a method for making semiconductor nanometer-scale wire. The method comprises the steps of: forming a nitride film on a semiconductor substrate by implanting a nitrogen ions at a high temperature; forming a nitride film pattern with several nanometer line width and spaced by several nanometer therebetween by using an Atomic Force Microscope; forming a silicon oxide film by selectively thermal-oxidizing an exposed portion of the semiconductor substrate; removing the nitride film pattern by using the Atomic Force Microscope; forming a semiconductor layer by using Molecular Beam Epitaxy method on the surface of the silicon oxide film and on the surface of the semiconductor substrate exposed by removing the nitride film pattern; and selectively removing the silicon oxide film and the semiconductor layer on the surface of the silicon oxide film through thermal treatment.

5 Claims, 2 Drawing Sheets

METHOD FOR MAKING SEMICONDUCTOR NANOMETER-SCALE WIRE USING AN ATOMIC FORCE MICROSCOPE

BACKGROUND OF THE INVENTION

1. Field of the Invention

The present invention relates to a method for making a silicon(Si) or germanium(Ge) semiconductor wire having a nanometer scale line width with ultrahigh purity under ultrahigh vacuum conditions, more particularly, to a method for making Si or Ge nanometer-scale wire on Si substrate using an Atomic Force Microscope(AFM) and surface chemical reactions.

2. Description of the Prior Art

Recently, in order to achieve an ultrahigh integrated device of ultrahigh speed, a semiconductor device must be small. For that, first of all, it should be technically solved that the line width of the pattern is small and the pattern is made of pure materials with fewer impurities.

Conventionally, the semiconductor nanometer-scale wire is made by a method using a high energy electron-beam. Thus, no less than several tens nanometer-scale wire was made due to the characteristics of the conventional high energy electron-beam. Therefore, there are problems that the device cannot be any more integrated and its purity is also degraded.

SUMMARY OF THE INVENTION

It is, therefore, an object of the invention to provide a method for making a semiconductor nanometer-scale wire of several nanometer-scale size by performing all processes under ultrahigh vacuum conditions for ultrahigh integrated device having ultrahigh purity.

In accordance with the present invention, there is provided a method for making a semiconductor nanometer-scale wire comprising the steps of:

forming a nitride film on a semiconductor substrate by implanting a nitrogen ions at a high temperature;

forming a nitride film pattern with several nanometer line width and spaced by several nanometer therebetween by using an Atomic Force Microscope;

forming a silicon oxide film by selectively thermal-oxidizing an exposed portion of the semiconductor substrate;

removing said nitride film pattern by using said Atomic Force Microscope;

forming a semiconductor layer by using Molecular Beam Epitaxy method on the surface of the silicon oxide film and the semiconductor substrate exposed by removing said nitride film pattern; and selectively removing said silicon oxide film and said semiconductor layer on the surface of the silicon oxide film through thermal treatment.

BRIEF DESCRIPTION OF THE DRAWINGS

The above and other objects and features of the present invention will become apparent from the following description of preferred embodiments given in conjunction with the accompanying drawings, in which.

DETAILED DESCRIPTION OF THE PREFERRED EMBODIMENTS

Figure 1A:
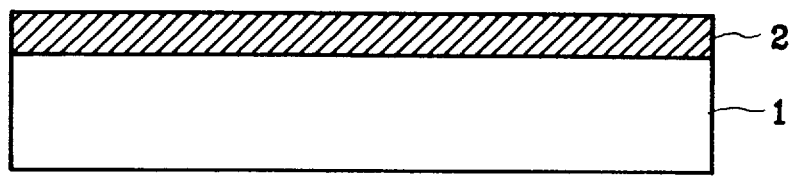
FIGS. 1A to 1F are cross-sectional views showing the process of making semiconductor nanometer-scale wire according to the present invention.

Referring to Fig.1A, a surface of a silicon substrate 1 is heated under ultrahigh vacuum conditions at the temperature of 1230° C. for several tens of seconds, and then the substrate is slowly cooled down to room temperature. The above process is repeated until the atomically clean substrate 1 is obtained. Then, nitrogen ion($N_2^+$) is generated with a low energy of about 100 eV by using an ions gun, and the nitrogen ions are implanted into the semiconductor substrate 1, while heating the semiconductor substrate 1 is heated to 980° C. As a result, an atomically even silicon nitride($Si_3N_4$) thin film 2 is obtained.

Figure 1B:
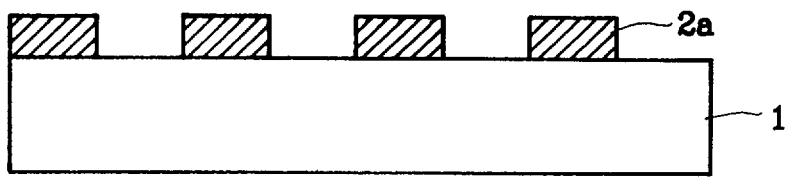

Next, a silicon nitride thin film pattern 2a with several nanometers-scale line width is formed and spaced by several nanometer therebetween by using an Atomic Force Microscope as shown in FIG. 1B. Thus, the surface of the silicon substrate is exposed between the patterned parts or adjacent lines made of silicon nitride.

Figure 1C:
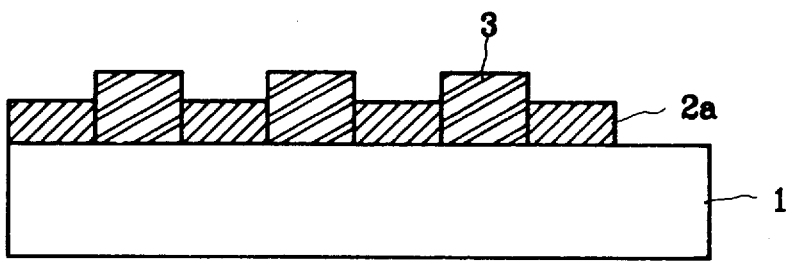

Referring to FIG.1C, a silicon oxide($SiO_2$) thin film 3 is selectively formed only on the exposed substrate surface between the patterned parts by thermally oxidizing the resultant structure in a vacuum chamber into which oxygen gas is supplied under high pressure at a high temperature.

Figure 1D:
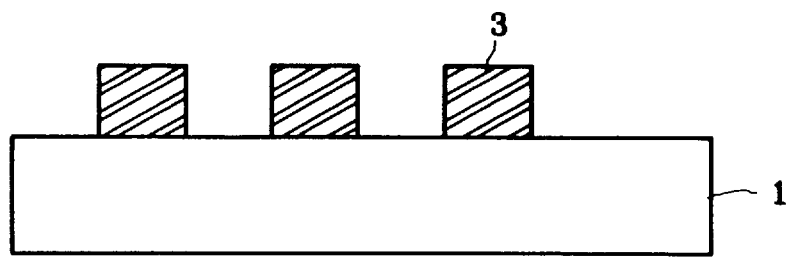

Subsequently, the silicon nitride thin film pattern 2a is removed by selectively scanning the silicon nitride thin film pattern 2a using the Atomic Force Microscope. The silicon substrate and silicon oxide thin wire can be alternatively represented on the surface as shown in FIG. 1D.

Figure 1E:
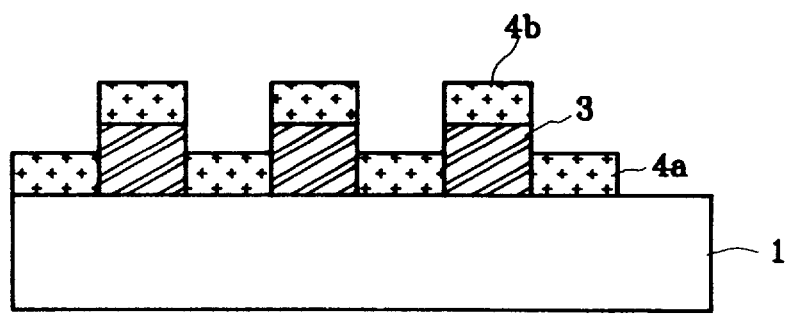

Afterwards, semiconductor layers 4a and 4b such as silicon layer or germanium layer are formed by using a Molecular Beam Epitaxy(MBE) method, on the surface of the semiconductor substrate exposed by removing the silicon nitride thin film pattern 2a and on the surface of the silicon oxide thin film 3, respectively, as shown in FIG. 1E.

Figure 1F:
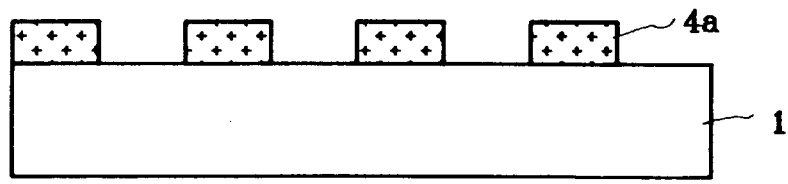

Finally, the silicon oxide thin film 3 is removed through thermal treatment to make a semiconductor nanometer-scale wire 4a shown in FIG. 1F. In order to remove the silicon oxide thin film 3, the temperature of the substrate is heated to about 800°C. As a result, the semiconductor layer 4b on the silicon oxide thin film 3 is also removed by the following reactions:

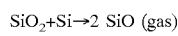

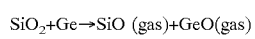

Therefore, the silicon substrate 1 and the junction semiconductor layer 4a are left to make Si or Ge nanometer-scale wire.

The line width of the pattern can be varied by controlling the thickness of the silicon nitride thin film and intensity of the Atomic Force Microscope according to the embodiments of the present invention. Additionally, a Si or Ge nanometer-scale wire can be deposited one atomic layer by one atomic layer.

In conclusion, since the method of the present invention forms a Si or Ge nanometer-scale wire only by using the Atomic Force Microscope and the surface chemical reactions under ultrahigh vacuum conditions, the resolution is largely improved to several nanometers. Also, the pattern of ultrahigh purity can be obtained because all process is performed under ultrahigh vacuum conditions maintaining a pressure below $10^{-10}$ Torr.

While the present invention has been described with respect to the particular embodiments, it will be apparent to those skilled in the art that various changes and modifications may be made without departing from the spirit and scope of the invention as defined in the following claims.

What is claimed is:

1. A method for making a semiconductor nanometer-scale wire comprising the steps of:

(a) forming a nitride film on a semiconductor substrate by implanting nitrogen ions at a high temperature;

(b) forming on said semiconductor substrate a nitride film pattern having adjacent lines of the nitride spaced by several namometers therebetween by using an Atomic Force Microscope to remove portions of said nitride film for selectively exposing the semiconductor substrate between said adjacent lines;

(c) forming a silicon oxide film by selectively thermal-oxidizing the exposed portion of the semiconductor substrate;

(d) removing said nitride film pattern by using and Atomic Force Misroscope;

(e) forming a semiconductor layer by using a Molecular Beam Epitaxy method on the surface of said silicon oxide film and on the surface of the semiconductor substrade exposed by removing said nitride film pattern; and (f) selectively removing said silicon oxide film and said semiconductor layer on the surface of said silicon oxide film through thermal treatment.

2. The method of claim 1, wherein said step (a) comprises the steps of:

heating a surface of said semiconductor substrate under ultrahigh vacuum conditions at 1230° C. for several tens of seconds;

slowly cooling down the temperature of said semiconductor substrate to the room temperature;

generating nitrogen ions with low energy of 100 eV by using an ion gun; and implanting said nitrogen ions into said semiconductor substrate, while heating the semiconductor substrate to 980° C.

3. The method of claim 1, wherein said step (f) is accomplished at the temperature of 800° C.

4. The method of claim 1, wherein said semiconductor substrate is a silicon substrate.

5. The method of claim 1, wherein said semiconductor layer formed by Molecular Beam Epitaxy method is one of a silicon layer and a germanium layer.

* * * * *